(12) United States Patent
Cok et al.

(10) Patent No.: US 8,796,700 B2
(45) Date of Patent: Aug. 5, 2014

(54) EMISSIVE DEVICE WITH CHIPLETS

(75) Inventors: Ronald S. Cok, Rochester, NY (US);
John W. Hamer, Rochester, NY (US)

(73) Assignee: Global OLED Technology LLC,
Herndon, VA (US)

( * ) Notice: Subject to any disclaimer, the term of this patent is extended or adjusted under 35 U.S.C. 154(b) by 542 days.

(21) Appl. No.: 12/271,952

(22) Filed: Nov. 17, 2008

(65) Prior Publication Data

US 2010/0123141 A1    May 20, 2010

(51) Int. Cl.
*H01L 29/88*    (2006.01)

(52) U.S. Cl.
USPC .......... 257/88; 257/40; 257/E21.499

(58) Field of Classification Search
USPC ............ 257/72, 88, 59, 347, 258, 658, 5,
257/E27.112, 13, 40, 79, 82, E51.001,
257/E51.003, 48, 84, 618, 776, 94–103,
257/E33.001, E21.499
See application file for complete search history.

(56) References Cited

U.S. PATENT DOCUMENTS

| | | | |
|---|---|---|---|
| 6,384,529 B2 | 5/2002 | Tang et al. | |
| 6,696,785 B2 * | 2/2004 | Shimoda et al. | 313/504 |
| 6,870,186 B2 * | 3/2005 | Park et al. | 257/59 |
| 6,919,681 B2 | 7/2005 | Cok et al. | |
| 6,987,355 B2 | 1/2006 | Cok | |
| 7,230,594 B2 | 6/2007 | Miller et al. | |
| 7,830,002 B2 * | 11/2010 | Cok et al. | 257/723 |
| 7,851,245 B2 * | 12/2010 | Jun et al. | 438/48 |
| 2002/0094701 A1 * | 7/2002 | Biegelsen et al. | 439/32 |
| 2003/0209713 A1 | 11/2003 | Kimura et al. | |
| 2004/0032637 A1 | 2/2004 | Imamura | |
| 2004/0140763 A1 * | 7/2004 | Buchwalter et al. | 313/506 |
| 2005/0184936 A1 | 8/2005 | Yamauchi et al. | |
| 2006/0055864 A1 | 3/2006 | Matsumura et al. | |
| 2006/0125407 A1 | 6/2006 | Jeong | |
| 2006/0197081 A1 * | 9/2006 | Tsuchiya | 257/40 |
| 2006/0220542 A1 * | 10/2006 | Suh et al. | 313/506 |
| 2007/0018150 A1 * | 1/2007 | Nakajima et al. | 257/10 |
| 2008/0197342 A1 * | 8/2008 | Lee et al. | 257/40 |

* cited by examiner

*Primary Examiner* — Cuong Q Nguyen
*Assistant Examiner* — Yosef Gebreyesus
(74) *Attorney, Agent, or Firm* — Global OLED Technology LLC

(57) ABSTRACT

An emissive device includes a substrate having a substrate surface; a chiplet adhered to the substrate surface, the chiplet having one or more connection pads; a bottom electrode formed on the substrate surface, one or more organic or inorganic light-emitting layers formed over the bottom electrode, and a top electrode formed over the one or more organic or inorganic light-emitting layers; an electrical conductor including a transition layer formed over only a portion of the chiplet and only a portion of the substrate surface, the transition layer exposing at least one connection pad, the electrical conductor formed in electrical contact with the exposed connection pad and the bottom electrode; and an LED spaced from the chiplet and including a layer of light-emissive material formed over the bottom electrode and a top electrode formed over the light-emissive layer.

17 Claims, 3 Drawing Sheets

EMISSIVE DEVICE WITH CHIPLETS

CROSS REFERENCE TO RELATED APPLICATION

Reference is made to U.S. patent application Ser. No. 12/191,478, entitled, "OLED DEVICE WITH EMBEDDED CHIP DRIVING," by Winters et al.

FIELD OF THE INVENTION

The present invention relates to light-emitting display devices employing independent control elements having separate substrates distributed over the device substrate, and more particularly, to a light-emissive device that is controlled by a chiplet.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored, light-emitting elements commonly referred to as sub-pixels, typically emitting red, green, and blue light, to represent each image element. A variety of flat-panel display technologies are known, for example plasma displays, liquid crystal displays, and light-emitting diode displays.

Light emitting diodes (LEDs) incorporating thin films of light-emitting materials forming light-emitting elements have many advantages in a flat-panel display device and are useful in optical systems. U.S. Pat. No. 6,384,529 issued May 7, 2002 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, charge transport, or charge blocking to the light-emitting-thin-film materials, and are known in the art. The materials are placed upon a substrate between electrodes, with an encapsulating cover layer or plate. Light is emitted from a sub-pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can comprise a patterned light-emissive layer wherein different materials are employed in the pattern to emit different colors of light when current passes through the materials. Alternatively, one can employ a single emissive layer, for example, a white-light emitter, together with color filters for forming a full-color display, as is taught in U.S. Pat. No. 6,987,355 entitled, "STACKED OLED DISPLAY HAVING IMPROVED EFFICIENCY" by Cok. It is also known to employ a white sub-pixel that does not include a color filter, for example, as taught in U.S. Pat. No. 6,919,681 entitled, "COLOR OLED DISPLAY WITH IMPROVED POWER EFFICIENCY" by Cok et al. A design employing an unpatterned white emitter has been proposed together with a four-color pixel comprising red, green, and blue color filters and sub-pixels and an unfiltered white sub-pixel to improve the efficiency of the device (see, e.g. U.S. Pat. No. 7,230,594 issued Jun. 12, 2007 to Miller, et al).

Two different methods for controlling the pixels in a flat-panel display device are generally known: active-matrix control and passive-matrix control. In an active-matrix device, control elements are distributed over the flat-panel substrate. Typically, each sub-pixel is controlled by one control element and each control element includes at least one transistor. For example, in a simple, prior-art active-matrix organic light-emitting (OLED) display, each control element includes two transistors (a select transistor and a power transistor) and one capacitor for storing a charge specifying the brightness of the sub-pixel. Each light-emitting element typically employs an independent control electrode and a common electrode.

One common, prior-art method of forming active-matrix control elements typically deposits thin films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of displays employing such materials.

Matsumura et al describe crystalline silicon substrates used for driving LCD displays in US Patent Application No. 2006/0055864. The application describes a method for selectively transferring and affixing pixel-control devices made from first semiconductor substrates onto a second planar display substrate. Wiring interconnections within the pixel-control device and connections from busses and control electrodes to the pixel-control device are shown.

There is a need, therefore, for an improved emissive device using incorporating a chiplet.

SUMMARY OF THE INVENTION

In accordance with the invention, an emissive device comprises:

a) a substrate having a substrate surface;

b) a chiplet adhered to the substrate surface, the chiplet having one or more connection pads;

c) a bottom electrode formed on the substrate surface, one or more organic or inorganic light-emitting layers formed over the bottom electrode, and a top electrode formed over the one or more organic or inorganic light-emitting layers;

d) an electrical conductor including a transition layer formed over only a portion of the chiplet and only a portion of the substrate surface, the transition layer exposing at least one connection pad, the electrical conductor formed in electrical contact with the exposed connection pad and the bottom electrode; and e) an LED spaced from the chiplet and including a layer of light-emissive material formed over the bottom electrode and a top electrode formed over the light-emissive layer.

ADVANTAGES

The present invention provides a simplified structure for controlling a light-emitting diode device that makes us of a chiplet.

DETAILED DESCRIPTION OF THE INVENTION

Figure 1:
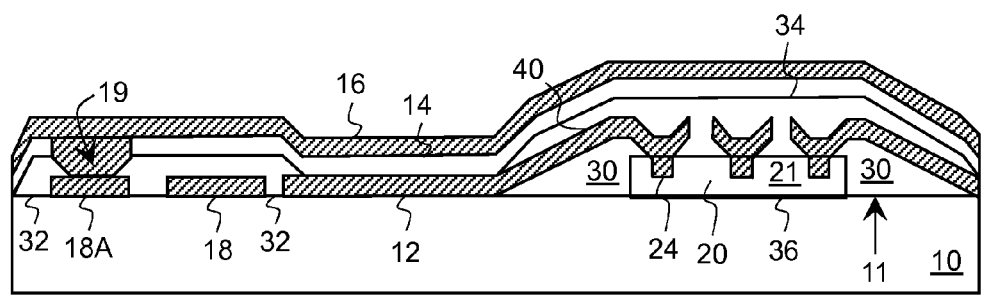
FIG. 1 is a partial cross-section of a device according to an embodiment of the present invention.

Referring to FIG. 1, in one embodiment of the present invention, an emissive device comprises a substrate 10 having a substrate surface 11, a chiplet 20 adhered to the substrate surface 11, the chiplet 20 comprising a separate substrate 21 and having one or more connection pads 24 formed on the chiplet 20. A transition layer 30 is located over only a portion of the chiplet 20 and only a portion of the substrate surface 11, exposing at least one connection pad 24. A bottom electrode 12 is formed on the substrate surface 11, one or more organic or inorganic light-emitting layers 14 are formed over the bottom electrode 12, and a top electrode 16 is formed over the one or more organic or inorganic light-emitting layers 14. An electrical conductor 40 forms an electrical contact with the exposed connection pad 24 and the bottom electrode 12. The one or more organic or inorganic light-emitting layers 14 and the top electrode 16 can be formed over more than the bottom electrode 12. In general, the one or more organic or inorganic light-emitting layers 14 and the top electrode 16 can be unpatterned, although the bottom electrode 12 is patterned to form active-matrix control for a light-emitting element. The chiplet 20 provides circuitry for controlling the bottom electrode 12 and can be used in place of conventional thin-film transistors comprising, for example, poly-silicon or amorphous silicon.

Winters et al. in commonly-assigned, co-pending U.S. patent application Ser. No. 12/191,478, entitled "OLED DEVICE WITH EMBEDDED CHIP DRIVING," which is hereby incorporated by reference in its entirety describes the use of a plurality of small, crystalline silicon pieces ("chiplets") in conjunction with a large glass substrate to provide active-matrix control in a display device. The chiplets contain driving elements such as transistors and are first formed on a semiconductor wafer. The small chiplet devices are then released from the silicon wafer substrate and mounted onto a glass display substrate. A series of planarization layers are employed to adhere and bury the chiplet. The present invention employs a transition layer to reduce the costs and improve the optical performance of an electro-optic display employing chiplets.

Figure 2:
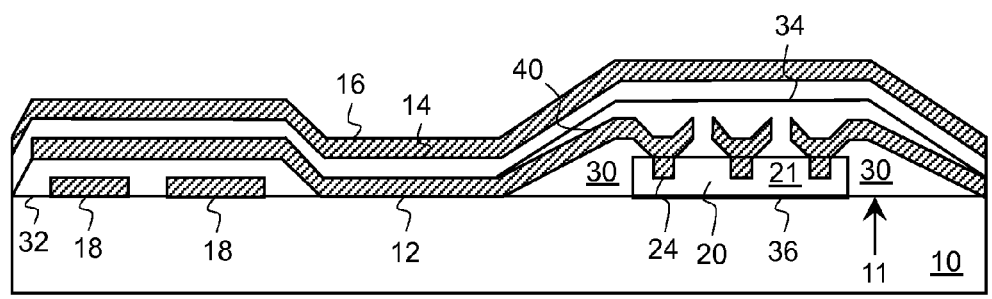
FIG. 2 is a partial cross-section of a device according to an alternative embodiment of the present invention.
Figure 3:
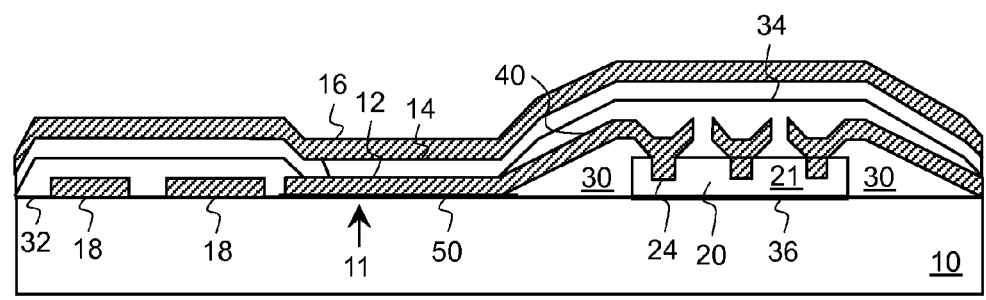
FIG. 3 is a partial cross-section of a device with a color filter according to another embodiment of the present invention.
Figure 4:
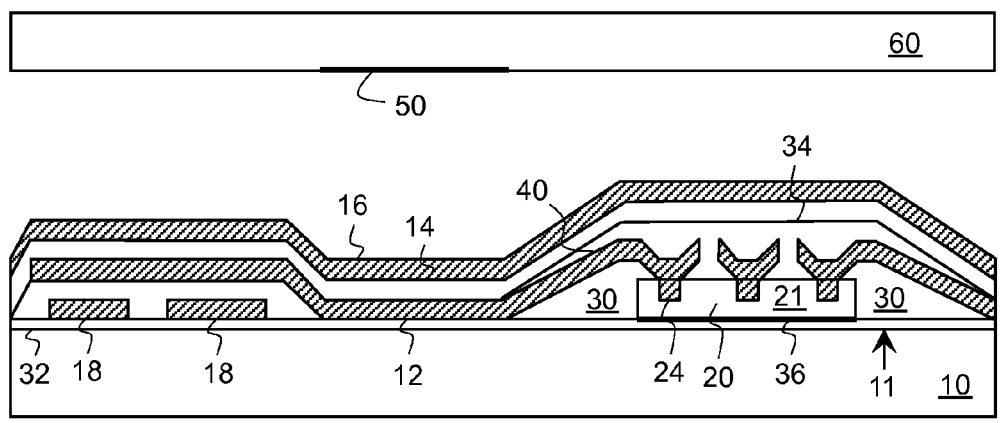
FIG. 4 is a partial cross-section of a device with a cover according to another embodiment of the present invention.

The present invention can be employed in both a top-emitter configuration and a bottom-emitter configuration. In a bottom-emitter configuration, the bottom electrode 12 is transparent, for example composed of ITO, and the top electrode 16 can be reflective, for example composed of a metal such as aluminum, silver, or magnesium, or metal alloys. In a bottom emitter configuration, the substrate 10 must also be transparent but there is no such restriction in a top-emitter configuration. In a top-emitter configuration, the bottom electrode 12 can be reflective although the top electrode 16 must be transparent. FIG. 1 illustrates an embodiment of the present invention that can be either top emitting or bottom emitting. FIG. 3 illustrates a bottom-emitter structure. FIGS. 2 and 4 are top-emitter structures.

An adhesive layer 36 can be formed over at least a portion of the substrate 10 and can be employed to adhere the chiplet 20 to the substrate 10. The adhesive layer 36 can be formed between the chiplet 20 and the substrate 10 only (as shown in FIG. 1) or the adhesive layer 36 can extend over the entire substrate 10 and form the substrate surface 11 (not shown). One or more busses 18 can be formed over the substrate 10 and can be employed to conduct power, ground, or control signals to a connection pad 24 on the chiplet 20. A buss-insulating layer 32 can insulate the busses 18 from the light-emitting layer 14. As shown in FIG. 1, a buss 18A can electrically connect to the top electrode 16 through a via 19 formed in the buss-insulating layer 32. A chiplet-insulating layer 34 likewise can insulate and protect the chiplet 20 and connection pads 24 from the light-emitting layer 14 or top electrode 16.

In either a top-emitter or a bottom-emitter configuration, an optional color filter can be employed to filter the light emitted by the light-emitting layer 14. Referring to FIG. 3, a color filter 50 can be formed between at least a portion of the substrate 10 and the bottom electrode 12. The color filter 50 can be formed directly on a portion of the substrate 10 or on portions of other layers formed over the substrate 10. In a top-emitter embodiment, a color filter 50 can be located on a cover 60 (FIG. 4) or directly on the top electrode 16 (not shown). In a display device, multiple color filters can be employed with multiple chiplets and multiple, independently controlled, bottom electrodes to make multiple pixel elements having differently colored sub-pixels. The color filters are especially useful in the case in which the light-emitting materials are not patterned over the substrate. Alternatively, different light-emitting materials may be patterned over the substrate in correspondence with the bottom electrode, each light-emitting material emitting a different color of light, to form a multi-colored display.

According to the present invention, any layer coated generally over the substrate 10 but not over or above the chiplet 20 or the bottom electrode 12 can form the substrate surface 11. Any layer patterned only between the chiplet 20 and substrate surface 11 (e.g. the adhesive layer 36) can be considered part of the chiplet 20 so that the chiplet 20 is adhered to the substrate surface 11, even in the presence of such a patterned layer. Likewise, any layer patterned only between the bottom electrode 12 and the substrate surface 11 (e.g. a color filter) is considered part of either the bottom electrode 12 or the substrate surface 11 so that the bottom electrode 12 is formed on the substrate surface 1, even in the presence of such a patterned layer. Alternatively, a layer coated over a portion of the substrate 10 but not extending over or above the chiplet 20 or the bottom electrode 12 and comprising different materials or deposited in a different step than the transition layer 30 can be considered to form a part of the substrate surface 11. In this alternative understanding, if a color filter 50 is employed between the substrate 10 and the bottom electrode 12, a surface of the color filter 50 can serve as the substrate surface 11 (FIG. 3). Hence, the light-emitting layer 14, top electrode 16, and chiplet-insulating layer 34 cannot be considered to form the substrate surface 11, although the color filter layer 50, buss-insulating layer 32 (in FIG. 2 only), or adhesive layer 36 could.

Although the design of FIG. 1 can be used both in top-emitter and bottom-emitter configurations, such a design limits the light-emitting area of the device. Referring to FIG. 2, the bottom electrode 12 extends over the one or more busses 18 and buss-insulating layer 32, thereby increasing the area in which light can be emitted by passing current through the light-emitting layer 14 from the top and bottom electrodes 16, 12 and forming a top-emitter structure.

Various embodiments of the present invention have the advantage of requiring minimal material since the substrate area covered by transition layer 30 is minimized and the buss-insulating layer 32 is restricted to only the substrate areas where it is needed. Likewise, the chiplet-insulating material 34 is minimized, as well as the chiplet adhesive layer 36.

Today a large-volume manufacturing infrastructure exists to make and sell "color-filter glass" for the LCD industry. These products include patterned color filters on glass, covered with a patterned transparent conductor—usually ITO. A low-cost embodiment of the current invention starts with this color-filter glass as the substrate and lower electrode for the emissive device.

Figure 5:
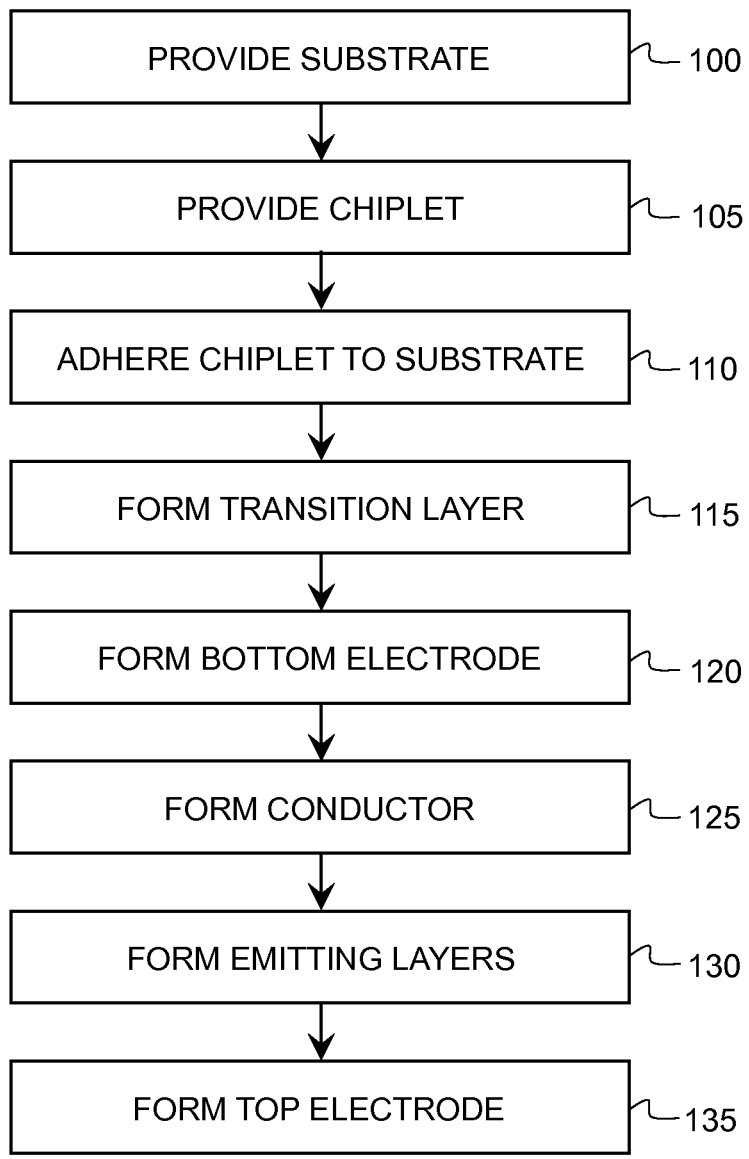
FIG. 5 is a flow graph illustrating the formation of a device according to an embodiment of the present invention.

According to a method of the present invention as described and shown in FIG. 5, an emissive device can be made by providing 100 a substrate having a substrate surface. A chiplet is provided 105 and adhered 110 to the substrate surface, the chiplet having one or more connection pads. A transition layer is formed 115 over only a portion of the chiplet and a portion of the substrate surface, the transition layer exposing at least one connection pad. A bottom electrode is formed 120 on the substrate surface. In one embodiment, the bottom electrode can be formed before the chiplets are adhered to the substrate; alternatively, the bottom electrode can be formed after the chiplets are adhered to the substrate. An electrical conductor is formed 125 in electrical contact with the exposed connection pad and the bottom electrode. One or more organic or inorganic light-emitting layers are formed 130 over the bottom electrode and a top electrode is formed 135 over the one or more organic or inorganic light-emitting layers. Generally, the electrical conductor is formed 125 before the light-emitting layers are formed 130 and the top electrode is formed 135.

In various embodiments of the present invention, the bottom electrode can be formed in a common step with the electrical conductor, thereby reducing manufacturing costs. One or more busses can be formed over the substrate and the busses formed in a common step with the bottom electrode or the busses can be formed in a common step with the electrical conductor (e.g. FIG. 1). A buss-insulating layer can be formed between the one or more busses and the bottom electrode. The buss-insulating layer can be formed in a common step with the transition layer (e.g. FIGS. 2 and 4). A chiplet-insulating layer can be formed over the chiplet and connection pads and beneath the one or more light-emitting layers or the top electrode. The buss-insulating layer can be formed in a common step with the chiplet-insulating layer (e.g. FIGS. 1 and 3). By forming elements of the present invention in common steps, processing steps and costs are reduced. Likewise the electrical conductor formed between the connection pad on the chiplet and the bottom electrode can be formed either before the bottom electrode, after the bottom electrode, or most desirably, in the same step as the bottom electrode in order to reduce processing steps and costs (e.g. FIG. 1).

One or more color filters can be formed between the substrate and the bottom electrode or above the top electrode, for example on a cover.

The present invention has the advantage of reducing the amount of material employed. This not only reduces the cost of the device but if light would have otherwise passed through the material, the present invention increases the light output efficiency of the device. Material, for example a resin, employed for the buss-insulating layer, chiplet-insulating layer, transition layer, or adhesive layer can be pattern-wise deposited using inkjet or micro-dispensing technologies known in the art. Alternatively, photolithographic methods known in the art can be used. Metal layers can be formed using evaporative methods with masks or with conventional photolithographic methods. Vias can be formed by patterned deposition or laser ablation.

An additional advantage of the present invention is that inkjet or micro-dispensing methods can be used to form the various insulating layers so that the materials employed do not necessarily need to be photoactive, as would be the case for conventional photolithographic processes. Hence, the materials can be less expensive. Moreover, if a photoactive material is used, the chiplets 20 themselves can be employed to mask (from above) adhesive material below the chiplets 20 when exposed to light, thereby removing the need for expensive masks and alignment procedures when adhering the chiplets 20 to the substrate 10. Similarly, masking a photo-curable resin with the chiplets 20 when exposed from below (through the substrate 10) can form and pattern the chiplet-insulating layer 34.

The device substrate 10 can comprise glass. The buss 18, top or bottom electrode 16, 12, or conductor 40 can be made of evaporated or sputtered metal, e.g. aluminum or silver, or metal alloy. The chiplet 20 can be formed using conventional techniques well established in the integrated circuit industry and located over the substrate 10 using methods described in co-pending, commonly assigned, U.S. application Ser. No. 12/191,478, referenced above. The insulation layers 30, 32, 34 can be made of resin. Commercially available materials (e.g. benzocyclobutene) can be employed to effectively adhere the chiplet and form the various insulating layers 30, 32, and 34.

Chiplets are separately manufactured from the display substrate and then applied to the display substrate. The chiplets are preferably manufactured using silicon or silicon on insulator (SOI) wafers using known processes for fabricating semiconductor devices. Each chiplet is then separated prior to attachment to the display substrate. The crystalline base of each chiplet can therefore be considered a substrate separate from the device substrate and over which the chiplet's circuitry is disposed. In particular, the independent chiplet substrate 21 is separate from the device substrate 10 on which the pixels are formed and the areas of the independent, chiplet substrates 21 for a multi-chiplet device, taken together, are smaller than the device substrate 10. Chiplets can have a crystalline substrate to provide higher performance active components than are found in, for example, thin-film amorphous or polycrystalline silicon devices. Chiplets can have a thickness preferably of 100 μm or less, and more preferably 20 μm or less. This facilitates formation of the transition layer 30 over a portion of the chiplet.

Since the chiplets 20 are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. Therefore, the circuitry of the chiplet for driving the pixels, such as the two transistors for each pixel, can be made small. The chiplet, however, also requires connection pads for making electrical connection to the wiring layer provided over the chiplets once assembled onto the display substrate. The connection pads must be sized based on the feature size of the lithography tools used on the display substrate (for example 5 μm) and the alignment of the chiplets to the wiring layer (for example +/−5 μm). Therefore, the connection pads can be, for example, 15 μm wide with 5 μm spaces between the pads. This means that the pads will generally be significantly larger than the transistor circuitry formed in the chiplet.

The connection pads 24 can generally be formed in a metallization layer on the chiplet 20 over the transistors. It is desirable to make the chiplet with as small a surface area as possible to enable a low manufacturing cost. Therefore, the size and number of the connection pads and not the transistors will generally limit the size of the chiplet.

The present invention can be employed in devices having a multi-pixel or multi-chiplet infrastructure and can be employed in either an active-matrix configuration in which the chiplet has circuitry that controls each pixel as an active-matrix element or as a passive-matrix controller. The present invention provides advantages when decreased costs and improved performance are important. In particular, the present invention can be practiced with active-matrix LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to Van Slyke et al. Inorganic devices, for example, employing quantum dots formed in a polycrystalline semiconductor matrix (for example, as taught in US Publication No. 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top-emitter architecture or bottom-emitter architecture.

The invention has been described in detail with particular reference to certain preferred embodiments thereof but it should be understood that variations and modifications could be effected within the spirit and scope of the invention.

PARTS LIST 10 device substrate
11 substrate surface
12 bottom electrode
14 light-emitting layer
16 top electrode
18, 18A buss
19 via
20 chiplet
24 connection pad
30 transition layer
32 buss-insulating layer
34 chiplet-insulating layer
36 adhesive layer
40 electrical conductor
50 color filter
60 cover
100 provide substrate step
105 provide chiplet step
110 adhere chiplet step
115 form transition layer step
120 form bottom electrode step
125 form conductor step
130 form emitting layers step
135 form top electrode step

What is claimed is:

1. An emissive device, comprising:
    a device substrate having a device substrate surface;
    an adhesive layer formed over at least a portion of the device substrate surface;
    a chiplet, with a substrate separate from the device substrate, adhered directly to the device substrate surface by the adhesive layer, the chiplet having one or more connection pads;
    a bottom electrode formed directly on the device substrate surface, one or more organic or inorganic light-emitting layers formed over the bottom electrode, and a top electrode formed over the one or more organic or inorganic light-emitting layers;
    an electrical conductor including an insulating transition layer formed over only a portion of the chiplet and only a portion of the device substrate surface, the insulating transition layer exposing at least one connection pad, the electrical conductor formed in electrical contact with the exposed connection pad and the bottom electrode; and
    wherein the bottom electrode, the one or more organic or inorganic light-emitting layers and the top electrode define an LED spaced from the chiplet; and
    further comprising one or more busses formed directly on the device substrate surface.

2. The emissive device of claim 1, wherein the one or more busses is formed in common with the bottom electrode or wherein the one or more busses is formed in common with the electrical conductor.

3. The emissive device of claim 1, wherein the bottom electrode extends over the one or more busses and further comprising a buss-insulating layer formed between the one or more busses and the bottom electrode.

4. The emissive device of claim 3, wherein the buss-insulating layer is formed in common with the transition layer.

5. The emissive device of claim 3, further comprising a chiplet-insulating layer disposed over the chiplet and the one or more connection pads and beneath the one or more organic or inorganic light-emitting layers or the top electrode, and wherein the buss-insulating layer is formed in common with the chiplet-insulating layer.

6. The emissive device of claim 1, wherein the one or more busses are connected to the one or more connection pads, the one or more busses are connected to the top electrode, or the top electrode is connected to a connection pad.

7. The emissive device of claim 1, further comprising a chiplet-insulating layer formed over the chiplet and the one or more connection pads and under the one or more organic or inorganic light-emitting layers or under the top electrode.

8. The emissive device of claim 1, wherein the one or more organic or inorganic light-emitting layers and the top electrode are not correspondingly patterned with respect to the bottom electrode.

9. The emissive device of claim 8, further comprising a color filter located above the top electrode.

10. The emissive device of claim 1, wherein the one or more organic or inorganic light-emitting layers are correspondingly patterned with respect to the bottom electrode.

11. The emissive device of claim 1, wherein the bottom electrode is formed in common with the electrical conductor.

12. The device of claim 1, wherein the bottom electrode, the light-emissive layer, and the top electrode form an organic or inorganic light-emitting diode.

13. The device of claim 1, further comprising a plurality of chiplets adhered to the device substrate and a plurality of bottom electrodes defining a plurality of light-emitting elements.

14. The device of claim 1, wherein the emissive device is a display.

15. An emissive device, comprising:
a device substrate having a device substrate surface;
an adhesive layer formed over at least a portion of the device substrate surface;
a chiplet, with a substrate separate from the device substrate, adhered to the device substrate surface by the adhesive layer, the chiplet having one or more connection pads;
a bottom electrode formed directly on the device substrate surface, one or more organic or inorganic light-emitting layers formed over the bottom electrode, and a top electrode formed over the one or more organic or inorganic light-emitting layers such that the bottom electrode, the one or more organic or inorganic light-emitting layers and the top electrode define an LED spaced from the chiplet;
an insulating transition layer formed over only a portion of the chiplet and only a portion of the device substrate surface, the insulating transition layer exposing at least one connection pad; and
an electrical conductor formed over the transition layer in electrical contact with the exposed connection pad and the bottom electrode;
wherein the bottom surface of the chiplet and a bottom surface of the bottom electrode are substantially a same height above the device substrate surface; and
further comprising one or more busses formed directly on the device substrate surface.

16. The emissive device of claim 15, further comprising a color filter located between the bottom electrode and the device substrate or above the top electrode.

17. The emissive device of claim 16, wherein the color filter is disposed on the device substrate surface below the bottom electrode.

* * * * *